US010727818B2

(12) United States Patent
Li et al.

(10) Patent No.: US 10,727,818 B2
(45) Date of Patent: Jul. 28, 2020

(54) CIRCUITS FOR DIGITAL AND ANALOG CONTROLLED OSCILLATORS

(71) Applicant: Intel Corporation, Santa Clara, CA (US)

(72) Inventors: Shenggao Li, Cupertino, CA (US); Sujatha Gowder, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/979,240

(22) Filed: May 14, 2018

(65) Prior Publication Data
US 2018/0269859 A1 Sep. 20, 2018

Related U.S. Application Data

(63) Continuation of application No. 14/583,679, filed on Dec. 27, 2014, now Pat. No. 9,973,176.

(51) Int. Cl.
H03K 3/03 (2006.01)
H03B 5/00 (2006.01)
H03L 7/099 (2006.01)
H03B 5/12 (2006.01)
H03L 7/18 (2006.01)
H03L 7/093 (2006.01)
H03K 5/00 (2006.01)
H03L 7/07 (2006.01)

(52) U.S. Cl.
CPC ............. H03K 3/0315 (2013.01); H03B 5/00 (2013.01); H03B 5/124 (2013.01); H03B 5/1246 (2013.01); H03B 5/1278 (2013.01); H03K 5/00 (2013.01); H03L 7/07 (2013.01); H03L 7/093 (2013.01); H03L 7/0995 (2013.01); H03L 7/18 (2013.01)

(58) Field of Classification Search
CPC ......... H03L 7/0995; H03L 7/18; H03L 7/093; H03L 7/07; H03B 5/1278; H03B 5/00; H03B 5/1246; H03B 5/124; H03K 3/0315; H03K 5/00
USPC .................... 331/57, 185, 175, 183; 327/156
See application file for complete search history.

(56) References Cited

U.S. PATENT DOCUMENTS 5,666,088 A * 9/1997 Penza ..................... H03K 3/013
331/175
5,864,258 A 1/1999 Cusinato et al.
9,455,727 B2 9/2016 Li et al.
(Continued)

OTHER PUBLICATIONS

Final Office Action from U.S. Appl. No. 14/583,679 dated Aug. 15, 2016, 9 pgs.
(Continued)

Primary Examiner — Arnold M Kinkead
(74) Attorney, Agent, or Firm — Green, Howard & Mughal LLP

(57) ABSTRACT

A circuit may comprise a first node, a ring oscillator, a regulator, and a Kvcc compensation circuit. The first node may be a supply node to provide a supply voltage for the circuit. The ring oscillator may be formed from inverters. The regulator may use a single transistor between the first node and a second node for powering the oscillator. The K compensation circuit may be used to provide to the oscillator a variable capacitive load that is dependent on the supply at the first supply node, and it may drag oscillator frequency down when the first node supply goes up.

17 Claims, 3 Drawing Sheets

(56) References Cited

U.S. PATENT DOCUMENTS

2002/0149433 A1    10/2002  Ingino
2010/0295580 A1    11/2010  Liu et al.
2011/0063004 A1*   3/2011   Chen .................. H03L 7/093
                                                       327/157

OTHER PUBLICATIONS

Non-Final Office Action from U.S. Appl. No. 14/583,679 dated Feb. 25, 2016, 8 pgs.
Non-Final Office Action dated Aug. 11, 2017 for U.S. Patent Application No.
Non-Final Office Action, dated Dec. 14, 2016, for U.S. Appl. No. 14/583,679.
Notice of Allowance from U.S. Appl. No. 14/583,679 dated Jan. 26, 2018, 14 pgs.
Notice of Allowance dated Apr. 11, 2017 for U.S. Appl. No. 14/583,679.
Wu, T. et al., "An On-Chip Calibration Technique for Reducing Supply Voltage Sensitivity in Ring Oscillators", Digest of Technical Papers. 2006 Symposium on VLSI Circuits, 2006. Jun. 15-17, 2006, Honolulu, HI, USA; DOI: 10.1109/VLSIC.2006.1705330; Date Added to IEEE Xplore: Feb. 20, 2007.

\* cited by examiner

CIRCUITS FOR DIGITAL AND ANALOG CONTROLLED OSCILLATORS

CLAIM OF PRIORITY

This application is a continuation of U.S. patent application Ser. No. 14/583,679, filed on Dec. 27, 2014, entitled "CIRCUITS FOR DIGITAL AND ANALOG CONTROLLED OSCILLATORS," the contents of which are incorporated by reference in their entirety.

FIELD OF THE INVENTION

The present invention relates generally to phase locked loop circuits including all digital phase locked loop circuits, and in particular, relates to ring oscillator control circuits in high speed applications.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Oscillators including both VCO (voltage controlled analog oscillators) and DCOs (digitally controlled oscillators) are commonly used for various applications including as part of PLLs (phase locked loops) to generate precise clock signals for clocking logic and for IO interfaces. Unfortunately, it is getting ever more difficult to build oscillators that can generate the high frequencies demanded today, especially in platforms requiring ever smaller supply voltages.

Some embodiments of the present invention are directed to reducing the supply noise sensitivity of ring oscillators including with both voltage controlled oscillators (VCOs) and digitally controlled oscillators (DCOs). Ring-oscillators are notorious for their high supply noise sensitivity (aka, high Kvcc), in addition to their high intrinsic jitter. (Kvcc is defined as $\Delta f / \Delta V$). As an example, for a 5 GHz center frequency, an oscillator Kvcc may be about 5.5 GHz/Volt. Such high Kvcc generally dictates a voltage regulator with very high PSRR to suppress supply noise. Because of the high Kvcc, the thermal and flicker noise of the regulator will have a strong impact to the overall oscillator jitter, and should NOT be overlooked.

Figure 1:
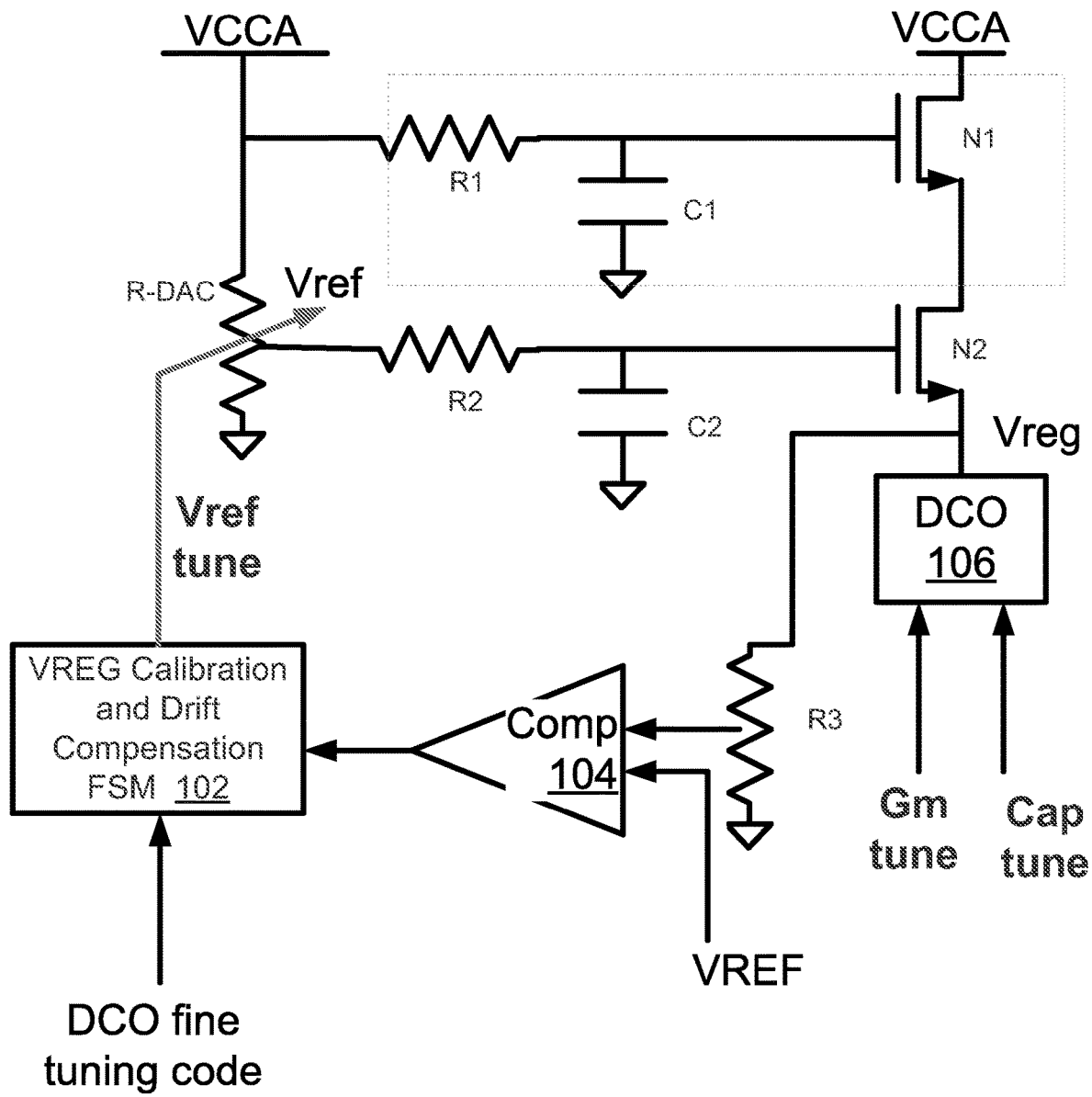
FIG. 1 shows a conventional cascaded regulator approach for mitigating the adverse effects of high Kvcc in a ring oscillator circuit.

FIG. 1 shows a prior art solution using a voltage regulation and drift compensation technique to provide a filtered supply for the oscillator (DCO 106). With this circuit, a two-stage cascaded NMOS (N1, N2) regulator is used for supplying power to the DCO 106. Noise is filtered through high frequency RC filters formed from R1, C1 and R2, C2. Comparator 104, calibration block 102, variable tuning resistor R-DAC, and resistor divider R3 regulate the oscillator supply (Vreg) against a reference voltage (VREF). In some implementations, it may provide 40+ dB PSRR while contributing negligible noise.

Unfortunately, a limitation of this topology is that VccA of the regulator input needs to be high enough to allow the regulated voltage (Vreg) to be reasonably high (say 1.0 volt). For applications where VccA is only 1.2-1.3 volts (or less), the topology has limited head-room, and may not be a good fit for high-speed applications.

Figure 2:
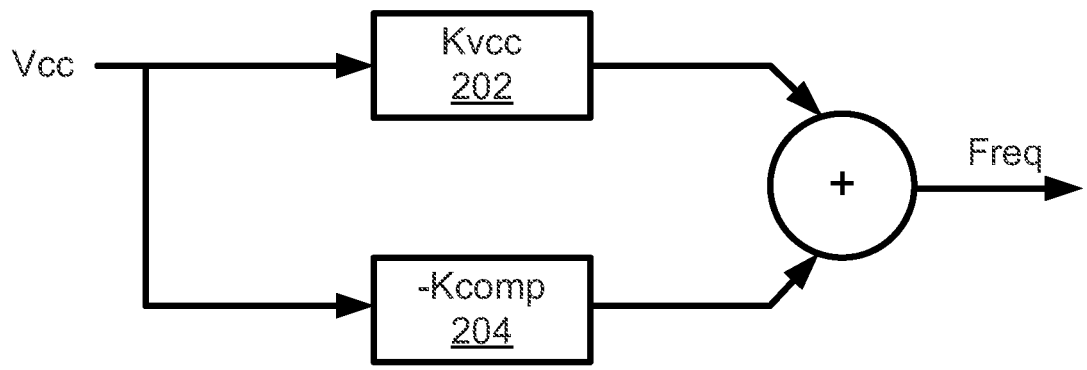
FIG. 2 conceptually illustrates a conventional approach for mitigating high Kvcc using K compensation.

With their high Kvcc values, ring oscillators have an extreme positive supply to frequency relationship. Even a tiny change in Vcc will cause a correspondingly significant change in oscillator frequency. With this in mind, and with reference to FIG. 2, some approaches attempt to offset this with negative K compensation circuits to sufficiently reduce the positive Kvcc. This is conceptually shown in FIG. 2 with the positive Kvcc 302 offset by a negative K compensation block 304. By calibrating Kcomp, the overall supply sensitivity may be reduced. Unfortunately, K compensation is a feed-forward methodology. Calibrating Kcomp to match exactly with Kvcc can require meticulous calibration. It may be a big challenge to get good calibration accuracy across PVT. In addition, generating a negative Kcomp of a reasonable magnitude may be limited also by circuit topology and oscillator frequency.

Figure 3:
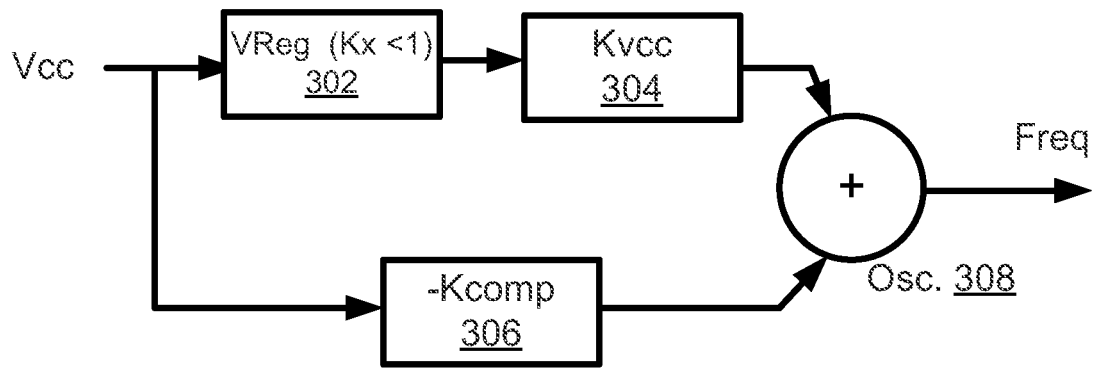
FIG. 3 conceptually illustrates an approach for mitigating against the adverse effects of high Kvcc in accordance with some embodiments.

With reference to FIG. 3, a new approach combining both of these techniques is provided. On the main path, the Vcc noise is attenuated using a lower profile voltage regulator 302 (requiring lower overhead for smaller supplies) to reduce the supply noise. A partial Kcomp compensation block 306 is also used to reduce oscillator supply sensitivity. The merit is at least two-fold. First, the Kcomp compensation range is reduced (not enough to completely offset Kvcc 304), but Kvcc is also effectively attenuated by Kx (VReg), which is <<1 (for example, Kx=0.1). Second, a coarse negative compensation reduces the PSRR requirement on the regulator. Thus, this approach eases both the regulator and compensator parameters that would otherwise be required.

Figure 4:
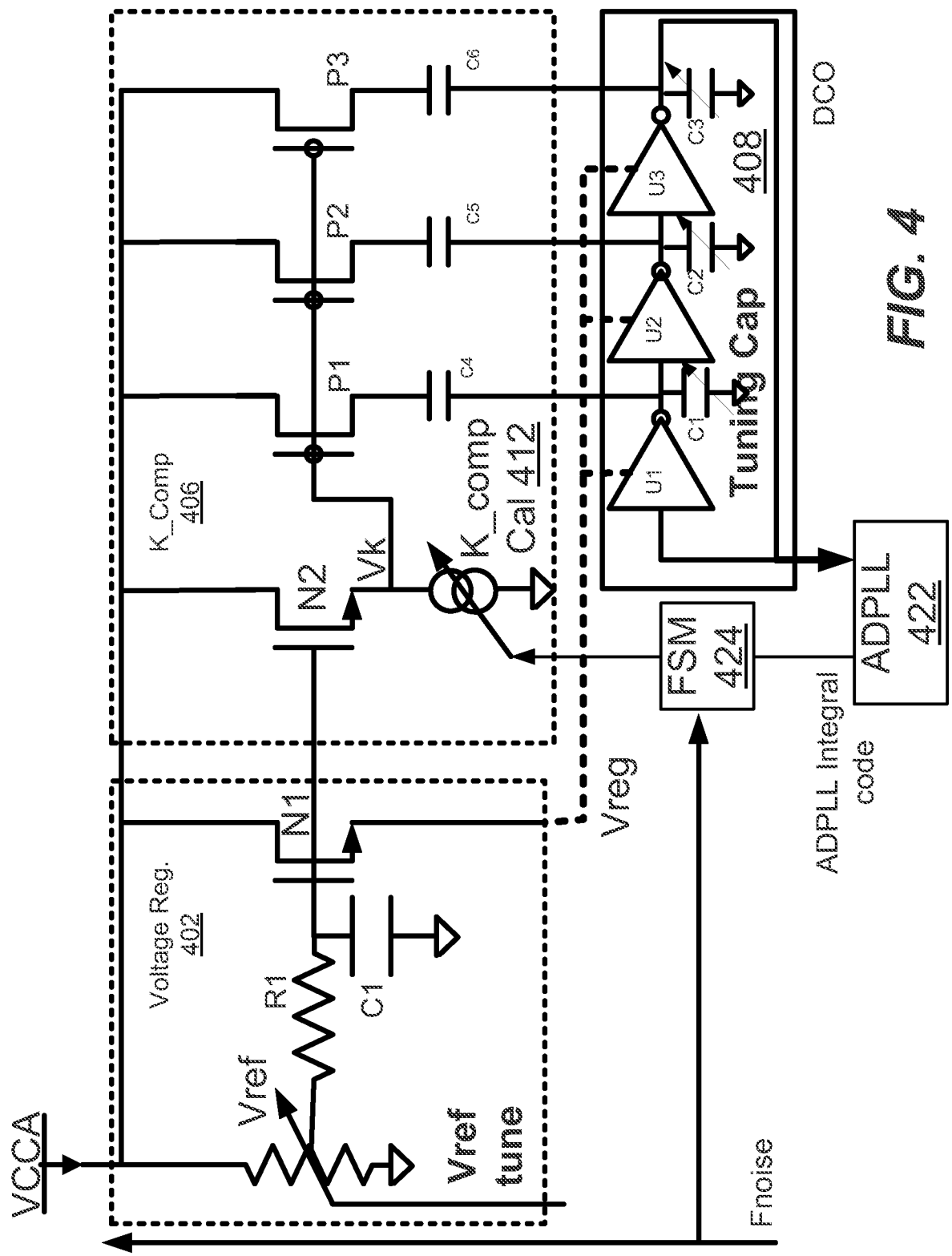
FIG. 4 is a diagram showing a regulated, compensated oscillator in a digital PLL in accordance with some embodiments.

FIG. 4 shows an oscillator with reduced noise sensitivity in accordance with some embodiments. It may be particularly well suited for high frequency IO (e.g., 25 G Ethernet, PCIe, etc.) applications with low noise requirements. The circuit generally comprises a voltage regulator 402, a K compensation block 406, ring oscillator 408, ADPLL block 422, and control logic (e.g., FSM) 424, all coupled together as shown. The ADPLL (all digital PLL) block 422 generally refers to DPLL blocks (phase comparator, filter, control, etc.), apart from the oscillator, for implementing a DPLL. The FSM logic 424, which may be part of the DPLL control/calibration functionality, may be used for tuning the K compensation block 406. Phase locked loops may be implemented in various different ways with different features and functionality. Accordingly, the invention should not be limited to any particular overall PLL configuration.

The oscillator 408 (DCO in this case) is a three-stage ring oscillator. Each stage (U1, U2, U3) comprises an inverter. This simple structure can allow for high-frequency operation (e.g., 10 GHz and above). (Note that the Kvcc of this type of oscillator is about K*f0, where K is 1 to 2, and f0 is the DCO center frequency. For example, Kvcc may vary from 12 to 24 GHz/Volt, for a center frequency of 12 GHz. The DCO also includes varactors (C1, c2, C3) for digitally tuning the oscillator.

The voltage regulator comprises an N-type transistor M1 (e.g., NMOS) with an RC-filter (R1, C1) to provide a more regulated, and filtered, supply Vreg. Unlike with cascaded regulators, this embodiment uses a single transistor stage, thereby allowing it to operate better with a lower VCCA (e.g., 1 or 1.2 V). While it is simple in design, It can still provide around 20 dB PSRR at frequencies higher than the bandwidth (e.g., 10×) of the RC-filter.

Changes in VCCA (due to noise not completely filtered by the regulator) without the included K comp circuit may cause the oscillator frequency to unacceptably fluctuate because the inverters run faster with larger supplies and slower with smaller supplies. As a counter measure, the Kcomp compensation circuit 406 employs load capacitors (C4, C5, and C6) coupled to the inverters through P-type (e.g., PMOS) transistors (P1, P2, P3) to increase capacitive load with the increase of VCCA, thus compensating for at least some of the frequency increase that would otherwise occur. The load capacitors (C4-C6) should be less than the oscillator tuning capacitors (C4-C6). For example, they may be 5 to 10 times less than the tuning capacitors. In one exemplary embodiment, load capacitors C4-C6 may be about 10 fF, while tuning capacitors (varactors) may be at nominal values of 70 to 90 fF.

The series transistors (P1, P2, P3) function as variable resistors. In some embodiments, transistor N2 is a replica of N1. This is to share the RC filter of the regulator. The voltage at the source of N2 is therefore filtered by R1, C1 and is stable. Also, changes in voltage Vk reasonably track changes in Vreg, which supplies power to the oscillator inverters. Thus, VCCA noise modulates the gate-to-source voltages of transistors P1-P3, and thus, their resistances change accordingly with changing VCCA. This causes the load capacitances (C1, C2, C3), as seen by the inverters, to go up (decreasing oscillator frequency) when VCCA increases and to go down (increasing oscillator frequency) when VCCA decreases. Hence, the compensator 406 provides a negative supply sensitivity. Note that KComp Cal 412 is an adjustable current source, which can be adjusted to calibrate nominal value of Vk, and thus, to calibrate the Kcomp block 406.

Figure 5:
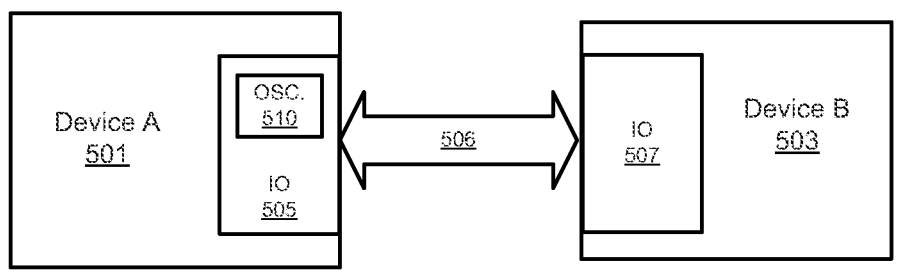
FIG. 5 is a block diagram showing devices coupled together through a communications link in accordance with some embodiments.

FIG. 5 generally shows first and second devices, Device A (501) and Device B (503) coupled together through a communications link 506. Device A includes IO interface 505 including one or more regulated and compensated oscillators 510, as taught herein. For example, it may be part of a DPLL for providing an IO interface clock. Similarly, Device B includes a corresponding IO interface 507 for communicating with Device A. In some embodiments, Devices A and B correspond to computing device chips (e.g., SoC, hub, processor, etc.).

With some embodiments discussed herein, Vcc may be reduced (e.g., less than 1.3 V). The prior-art in FIG. 1 has excellent noise performance, and high-PSRR, but it requires a higher supply voltage due to the cascaded NMOS regulator. A charge-pump circuit may even be required to provide sufficient voltage head-room. In addition, inverter based ring-oscillators have simple topologies, and can offer high operation speed. This approach allows for the use of small loading caps for Kvcc compensation purposes, which means that the oscillator core can be kept small, a key for high-speed operation.

In the preceding description, numerous specific details have been set forth. However, it is understood that embodiments of the invention may be practiced without these specific details. In other instances, well-known circuits, structures and techniques may have not been shown in detail in order not to obscure an understanding of the description.

With this in mind, references to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the preceding description and following claims, the following terms should be construed as follows: The terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

The term "PMOS transistor" refers to a P-type metal oxide semiconductor field effect transistor. Likewise, "NMOS transistor" refers to an N-type metal oxide semiconductor field effect transistor. It should be appreciated that whenever the terms: "MOS transistor", "NMOS transistor", or "PMOS transistor" are used, unless otherwise expressly indicated or dictated by the nature of their use, they are being used in an exemplary manner. They encompass the different varieties of MOS devices including devices with different VTs, material types, insulator thicknesses, gate(s) configurations, to mention just a few. Moreover, unless specifically referred to as MOS or the like, the term transistor can include other suitable transistor types, e.g., junction-field-effect transistors, bipolar-junction transistors, metal semiconductor FETs, and various types of three dimensional transistors, MOS or otherwise, known today or not yet developed.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

It should also be appreciated that in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

It should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS., for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. An apparatus comprising:
   an oscillator having at least three delay circuits coupled together in series and with a feedback path to form a ring configuration, wherein at least one delay circuit has an input and an output with an adjustable capacitive load;
   a circuitry coupled to the oscillator, wherein the circuitry is to provide an RC load to the adjustable capacitive load, of the at least one delay circuit;
   an adjustable current source coupled to the circuitry to adjust the RC load of the circuitry; and
   a finite state machine to adjust current strength of the adjustable current source.

2. The apparatus of claim 1, wherein the RC load comprises a capacitor and a transistor coupled in series with the capacitor.

3. The apparatus of claim 2, wherein the capacitor of the RC load is smaller in capacitance than a capacitance of the adjustable capacitive load.

4. The apparatus of claim 2, wherein the transistor is connected to a first power supply rail separate from a second power supply rail coupled to the oscillator.

5. The apparatus of claim 4 comprises a voltage regulator coupled to the first and second power supply rails and to the circuitry, wherein the first power supply rail is to provide an input power supply to the voltage regulator, and wherein the second power supply is to provide a regulated power supply to the oscillator.

6. the apparatus of claim 5, wherein the RC load is to increase when the regulated power supply from the second power supply rail increases.

7. The apparatus of claim 2, wherein the transistor is a p-type transistor.

8. The apparatus of claim 1, wherein the oscillator is one of a digitally controlled oscillator (DCO) or a voltage controlled oscillator (VCO).

9. An apparatus comprising:
   a first circuitry having a first gain defined by a difference in its output frequency relative to a difference in power supply;
   a second circuitry coupled to the first circuitry, wherein the second circuitry is to provide a regulated power supply to the first circuitry, and is to attenuate the first gain; and
   a third circuitry having a second gain which is subtracted from the first gain
   wherein the third circuitry comprises an adjustable current source, and wherein the apparatus comprises a finite state machine to adjust current strength of the adjustable current source to adjust the second gain.

10. The apparatus of claim 9, wherein the first circuitry comprises an oscillator which is one of a digitally controlled oscillator (DCO) or a voltage controlled oscillator (VCO).

11. The apparatus of claim 9, wherein the second circuitry comprises a voltage regulator.

12. The apparatus of claim 9, wherein the third circuitry comprises an RC load including a capacitor and a transistor coupled in series with a capacitor of the ring oscillator.

13. A system comprising:
    a first device; and
    a second device coupled to the first device through a communications link, wherein the first device includes:
      an oscillator having at least three delay circuits coupled together in series and with a feedback path to form a ring configuration, wherein at least one delay circuit has an input and an output with an adjustable capacitive load;
      a circuitry coupled to the oscillator, wherein the circuitry is to provide an RC load to the adjustable capacitive load, of the at least one delay circuit; and
      an adjustable current source coupled to the circuitry to adjust the RC load of the circuitry
      wherein the capacitor of the RC load is smaller in capacitance than a capacitance of the adjustable capacitive load.

14. The system of claim 13, wherein the RC load comprises a capacitor and a transistor coupled in series with the capacitor.

15. The system of claim 14, wherein the transistor is connected to a first power supply rail separate from a second power supply rail coupled to the oscillator.

16. The system of claim 15 comprises:
    a voltage regulator coupled to the first and second power supply rails and to the circuitry, wherein the first power supply rail is to provide an input power supply to the voltage regulator, and wherein the second power supply rail is to provide a regulated power supply to the oscillator; and
    a finite state machine to adjust current strength of adjustable current source.

17. The system of claim 16, wherein the RC load is to increase when a power supply on the second power supply rail increases.

* * * * *